US012805395B2

(12) United States Patent
Workman et al.

(10) Patent No.: US 12,805,395 B2
(45) Date of Patent: Nov. 17, 2026

(54) BONDED DEBUGGING ELEMENTS FOR INTEGRATED CIRCUITS AND METHODS FOR DEBUGGING INTEGRATED CIRCUITS USING SAME

(71) Applicant: ADEIA SEMICONDUCTOR BONDING TECHNOLOGIES INC., San Jose, CA (US)

(72) Inventors: Thomas Workman, San Jose, CA (US); Belgacem Haba, Saratoga, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 467 days.

(21) Appl. No.: 18/366,569

(22) Filed: Aug. 7, 2023

(65) Prior Publication Data

US 2024/0055407 A1 Feb. 15, 2024

Related U.S. Application Data

(60) Provisional application No. 63/371,195, filed on Aug. 11, 2022.

(51) Int. Cl.

| | |
|---|---|
| ***H01L 25/065*** | (2023.01) |
| ***G01R 31/28*** | (2006.01) |
| ***H10W 20/43*** | (2026.01) |
| ***H10W 90/00*** | (2026.01) |

(52) U.S. Cl.

CPC ........ *H10W 90/00* (2026.01); *G01R 31/2884* (2013.01); *H10W 20/43* (2026.01); *H10W 90/792* (2026.01)

(58) Field of Classification Search

None

See application file for complete search history.

(56) References Cited

U.S. PATENT DOCUMENTS

| | | | |
|---|---|---|---|
| 5,753,536 | A | 5/1998 | Sugiyama et al. |
| 5,771,555 | A | 6/1998 | Eda et al. |
| 6,080,640 | A | 6/2000 | Gardner et al. |
| 6,423,640 | B1 | 7/2002 | Lee et al. |
| 6,465,892 | B1 | 10/2002 | Suga |

(Continued)

FOREIGN PATENT DOCUMENTS

| | | | |
|---|---|---|---|
| CN | 111477612 | A | 7/2020 |
| CN | 211929489 | U | 11/2020 |

(Continued)

OTHER PUBLICATIONS

Campbell, Richard, "What Is Built-In Self Test and Why Do We Need It?," Evaluation Engineering, Mar. 1, 1996, 20 pages.

(Continued)

*Primary Examiner* — Lawrence C Tynes, Jr.

(74) *Attorney, Agent, or Firm* — Knobbe, Martens, Olson & Bear, LLP

(57) ABSTRACT

A bonded structure for debugging integrated circuit devices and a method for debugging integrated circuit devices is disclosed. The bonded structure may comprise a debugging element and an integrated circuit device. The debugging element may comprise a debugging circuitry. The debugging element may be bonded to an integrated circuit device. The debugging element may be configured to debug the integrated circuit device.

20 Claims, 6 Drawing Sheets

(56) References Cited

U.S. PATENT DOCUMENTS

| | | | |
|---|---|---|---|
| 6,675,469 | B1 | 1/2004 | Haba et al. |
| 6,887,769 | B2 | 5/2005 | Kellar et al. |
| 6,908,027 | B2 | 6/2005 | Tolchinsky et al. |
| 7,045,453 | B2 | 5/2006 | Canaperi et al. |
| 7,105,980 | B2 | 9/2006 | Abbott et al. |
| 7,193,423 | B1 | 3/2007 | Dalton et al. |
| 7,660,776 | B1 | 2/2010 | Kious |
| 7,750,488 | B2 | 7/2010 | Patti et al. |
| 7,803,693 | B2 | 9/2010 | Trezza |
| 8,183,127 | B2 | 5/2012 | Patti et al. |
| 8,349,635 | B1 | 1/2013 | Gan et al. |
| 8,377,798 | B2 | 2/2013 | Peng et al. |
| 8,441,131 | B2 | 5/2013 | Ryan |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,524,533 | B2 | 9/2013 | Tong et al. |
| 8,566,612 | B2 | 10/2013 | Davis et al. |
| 8,620,164 | B2 | 12/2013 | Heck et al. |
| 8,647,987 | B2 | 2/2014 | Yang et al. |
| 8,697,493 | B2 | 4/2014 | Sadaka |
| 8,716,105 | B2 | 5/2014 | Sadaka et al. |
| 8,802,538 | B1 | 8/2014 | Liu |
| 8,809,123 | B2 | 8/2014 | Liu et al. |
| 8,841,002 | B2 | 9/2014 | Tong |
| 9,093,350 | B2 | 7/2015 | Endo et al. |
| 9,142,517 | B2 | 9/2015 | Liu et al. |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,257,399 | B2 | 2/2016 | Kuang et al. |
| 9,299,736 | B2 | 3/2016 | Chen et al. |
| 9,312,229 | B2 | 4/2016 | Chen et al. |
| 9,331,149 | B2 | 5/2016 | Tong et al. |
| 9,337,235 | B2 | 5/2016 | Chen et al. |
| 9,385,024 | B2 | 7/2016 | Tong et al. |
| 9,394,161 | B2 | 7/2016 | Cheng et al. |
| 9,431,368 | B2 | 8/2016 | Enquist et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,620,481 | B2 | 4/2017 | Edelstein et al. |
| 9,656,852 | B2 | 5/2017 | Cheng et al. |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,799,587 | B2 | 10/2017 | Fujii et al. |
| 9,852,988 | B2 | 12/2017 | Enquist et al. |
| 9,893,004 | B2 | 2/2018 | Yazdani |
| 9,899,442 | B2 | 2/2018 | Katkar |
| 9,929,050 | B2 | 3/2018 | Lin |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 10,002,844 | B1 | 6/2018 | Wang et al. |
| 10,026,605 | B2 | 7/2018 | Doub et al. |
| 10,075,657 | B2 | 9/2018 | Fahim et al. |
| 10,204,893 | B2 | 2/2019 | Uzoh et al. |
| 10,269,756 | B2 | 4/2019 | Uzoh |
| 10,276,619 | B2 | 4/2019 | Kao et al. |
| 10,276,909 | B2 | 4/2019 | Huang et al. |
| 10,418,277 | B2 | 9/2019 | Cheng et al. |
| 10,446,456 | B2 | 10/2019 | Shen et al. |
| 10,446,487 | B2 | 10/2019 | Huang et al. |
| 10,446,532 | B2 | 10/2019 | Uzoh et al. |
| 10,508,030 | B2 | 12/2019 | Katkar et al. |
| 10,522,499 | B2 | 12/2019 | Enquist et al. |
| 10,637,233 | B2 | 4/2020 | Hao |
| 10,707,087 | B2 | 7/2020 | Uzoh et al. |
| 10,784,191 | B2 | 9/2020 | Huang et al. |
| 10,790,262 | B2 | 9/2020 | Uzoh et al. |
| 10,840,135 | B2 | 11/2020 | Uzoh |
| 10,840,205 | B2 | 11/2020 | Fountain, Jr. et al. |
| 10,854,578 | B2 | 12/2020 | Morein |
| 10,879,212 | B2 | 12/2020 | Uzoh et al. |
| 10,886,177 | B2 | 1/2021 | DeLaCruz et al. |
| 10,892,246 | B2 | 1/2021 | Uzoh |
| 10,923,408 | B2 | 2/2021 | Huang et al. |
| 10,923,413 | B2 | 2/2021 | DeLaCruz |
| 10,950,547 | B2 | 3/2021 | Mohammed et al. |
| 10,964,664 | B2 | 3/2021 | Mandalapu et al. |
| 10,985,133 | B2 | 4/2021 | Uzoh |
| 10,991,804 | B2 | 4/2021 | DeLaCruz et al. |
| 10,998,292 | B2 | 5/2021 | Lee et al. |
| 11,004,757 | B2 | 5/2021 | Katkar et al. |
| 11,011,494 | B2 | 5/2021 | Gao et al. |
| 11,011,503 | B2 | 5/2021 | Wang et al. |
| 11,031,285 | B2 | 6/2021 | Katkar et al. |
| 11,037,919 | B2 | 6/2021 | Uzoh et al. |
| 11,056,348 | B2 | 7/2021 | Theil |
| 11,069,734 | B2 | 7/2021 | Katkar |
| 11,088,099 | B2 | 8/2021 | Katkar et al. |
| 11,127,738 | B2 | 9/2021 | DeLaCruz et al. |
| 11,158,573 | B2 | 10/2021 | Uzoh et al. |
| 11,158,606 | B2 | 10/2021 | Gao et al. |
| 11,169,326 | B2 | 11/2021 | Huang et al. |
| 11,171,117 | B2 | 11/2021 | Gao et al. |
| 11,176,450 | B2 | 11/2021 | Teig et al. |
| 11,195,748 | B2 | 12/2021 | Uzoh et al. |
| 11,205,625 | B2 | 12/2021 | DeLaCruz et al. |
| 11,244,920 | B2 | 2/2022 | Uzoh |
| 11,256,004 | B2 | 2/2022 | Haba et al. |
| 11,264,357 | B1 | 3/2022 | DeLaCruz et al. |
| 11,276,676 | B2 | 3/2022 | Enquist et al. |
| 11,296,044 | B2 | 4/2022 | Gao et al. |
| 11,296,053 | B2 | 4/2022 | Uzoh et al. |
| 11,329,034 | B2 | 5/2022 | Tao et al. |
| 11,348,898 | B2 | 5/2022 | DeLaCruz et al. |
| 11,355,404 | B2 | 6/2022 | Gao et al. |
| 11,355,443 | B2 | 6/2022 | Huang et al. |
| 11,367,652 | B2 | 6/2022 | Uzoh et al. |
| 11,373,963 | B2 | 6/2022 | DeLaCruz et al. |
| 11,380,597 | B2 | 7/2022 | Katkar et al. |
| 11,385,278 | B2 | 7/2022 | DeLaCruz et al. |
| 11,387,202 | B2 | 7/2022 | Haba et al. |
| 11,387,214 | B2 | 7/2022 | Wang et al. |
| 11,393,779 | B2 | 7/2022 | Gao et al. |
| 11,462,419 | B2 | 10/2022 | Haba |
| 11,476,213 | B2 | 10/2022 | Haba et al. |
| 11,500,010 | B2 | 11/2022 | Rowling et al. |
| 11,515,291 | B2 | 11/2022 | DeLaCruz et al. |
| 11,610,846 | B2 | 3/2023 | Haba et al. |
| 11,728,287 | B2 | 8/2023 | DeLaCruz et al. |
| 11,848,284 | B2 | 12/2023 | DeLaCruz et al. |
| 12,591,005 | B2 | 3/2026 | Haba et al. |
| 2003/0221152 | A1 | 11/2003 | Volkerink et al. |
| 2004/0084414 | A1 | 5/2004 | Sakai et al. |
| 2004/0175850 | A1 | 9/2004 | Shimizu et al. |
| 2006/0057945 | A1 | 3/2006 | Hsu et al. |
| 2007/0111386 | A1 | 5/2007 | Kim et al. |
| 2008/0088996 | A1 | 4/2008 | Bonvalot et al. |
| 2014/0175655 | A1 | 6/2014 | Chen et al. |
| 2014/0264739 | A1 | 9/2014 | Morrow et al. |
| 2015/0046612 | A1 | 2/2015 | Gupta |
| 2015/0064498 | A1 | 3/2015 | Tong |
| 2016/0343682 | A1 | 11/2016 | Kawasaki |
| 2017/0047260 | A1 | 2/2017 | Huang et al. |
| 2018/0106851 | A1 | 4/2018 | Schweitzer, III et al. |
| 2018/0151247 | A1 | 5/2018 | Sato |
| 2018/0175012 | A1 | 6/2018 | Wu et al. |
| 2018/0182639 | A1 | 6/2018 | Uzoh et al. |
| 2018/0182666 | A1 | 6/2018 | Uzoh et al. |
| 2018/0190580 | A1 | 7/2018 | Haba et al. |
| 2018/0190583 | A1 | 7/2018 | DeLaCruz et al. |
| 2018/0219038 | A1 | 8/2018 | Gambino et al. |
| 2018/0323177 | A1 | 11/2018 | Yu et al. |
| 2018/0323227 | A1 | 11/2018 | Zhang et al. |
| 2018/0331066 | A1 | 11/2018 | Uzoh et al. |
| 2019/0115277 | A1 | 4/2019 | Yu et al. |

(56) References Cited

U.S. PATENT DOCUMENTS

| | | | |
|---|---|---|---|
| 2019/0131277 | A1 | 5/2019 | Yang et al. |
| 2019/0170814 | A1 | 6/2019 | Yun |
| 2019/0179785 | A1 | 6/2019 | Keeth et al. |
| 2019/0333550 | A1 | 10/2019 | Fisch |
| 2019/0385935 | A1 | 12/2019 | Gao et al. |
| 2020/0013765 | A1 | 1/2020 | Fountain, Jr. et al. |
| 2020/0035641 | A1 | 1/2020 | Fountain, Jr. et al. |
| 2020/0091115 | A1 | 3/2020 | Wu et al. |
| 2020/0133902 | A1 | 4/2020 | Tang et al. |
| 2020/0294908 | A1 | 9/2020 | Haba et al. |
| 2020/0328162 | A1 | 10/2020 | Haba et al. |
| 2020/0395321 | A1 | 12/2020 | Katkar et al. |
| 2021/0098412 | A1 | 4/2021 | Haba et al. |
| 2021/0118864 | A1 | 4/2021 | DeLaCruz et al. |
| 2021/0143125 | A1 | 5/2021 | DeLaCruz et al. |
| 2021/0181510 | A1 | 6/2021 | Katkar et al. |
| 2021/0193603 | A1 | 6/2021 | DeLaCruz et al. |
| 2021/0193624 | A1 | 6/2021 | DeLaCruz et al. |
| 2021/0193625 | A1 | 6/2021 | Katkar et al. |
| 2021/0242152 | A1 | 8/2021 | Fountain, Jr. et al. |
| 2021/0265313 | A1 | 8/2021 | Chen et al. |
| 2021/0296282 | A1 | 9/2021 | Gao et al. |
| 2021/0305202 | A1 | 9/2021 | Uzoh et al. |
| 2021/0366820 | A1 | 11/2021 | Uzoh |
| 2021/0407941 | A1 | 12/2021 | Haba |
| 2022/0077063 | A1 | 3/2022 | Haba |
| 2022/0077087 | A1 | 3/2022 | Haba |
| 2022/0102224 | A1 | 3/2022 | An et al. |
| 2022/0139867 | A1 | 5/2022 | Uzoh |
| 2022/0139869 | A1 | 5/2022 | Gao et al. |
| 2022/0208650 | A1 | 6/2022 | Gao et al. |
| 2022/0208702 | A1 | 6/2022 | Uzoh |
| 2022/0208723 | A1 | 6/2022 | Katkar et al. |
| 2022/0237138 | A1 | 7/2022 | Lanka et al. |
| 2022/0246497 | A1 | 8/2022 | Fountain, Jr. et al. |
| 2022/0285303 | A1 | 9/2022 | Mirkarimi et al. |
| 2022/0318111 | A1 | 10/2022 | Choudhary et al. |
| 2022/0319901 | A1 | 10/2022 | Suwito et al. |
| 2022/0320035 | A1 | 10/2022 | Uzoh et al. |
| 2022/0320036 | A1 | 10/2022 | Gao et al. |
| 2023/0005850 | A1 | 1/2023 | Fountain, Jr. |
| 2023/0019869 | A1 | 1/2023 | Mirkarimi et al. |
| 2023/0036441 | A1 | 2/2023 | Haba et al. |
| 2023/0067677 | A1 | 3/2023 | Lee et al. |
| 2023/0069183 | A1 | 3/2023 | Haba |
| 2023/0100032 | A1 | 3/2023 | Haba et al. |
| 2023/0115122 | A1 | 4/2023 | Uzoh et al. |
| 2023/0122531 | A1 | 4/2023 | Uzoh |
| 2023/0123423 | A1 | 4/2023 | Gao et al. |
| 2023/0125395 | A1 | 4/2023 | Gao et al. |
| 2023/0130259 | A1 | 4/2023 | Haba et al. |
| 2023/0132632 | A1 | 5/2023 | Katkar et al. |
| 2023/0140107 | A1 | 5/2023 | Uzoh et al. |
| 2023/0142680 | A1 | 5/2023 | Guevara et al. |
| 2023/0154816 | A1 | 5/2023 | Haba et al. |
| 2023/0154828 | A1 | 5/2023 | Haba et al. |
| 2023/0187264 | A1 | 6/2023 | Uzoh et al. |
| 2023/0187317 | A1 | 6/2023 | Uzoh |
| 2023/0187407 | A1* | 6/2023 | Molnar ............... H01L 25/0652 257/777 |
| 2023/0187412 | A1 | 6/2023 | Gao et al. |
| 2023/0197453 | A1 | 6/2023 | Fountain, Jr. et al. |
| 2023/0197496 | A1 | 6/2023 | Theil |
| 2023/0197559 | A1 | 6/2023 | Haba et al. |
| 2023/0197560 | A1 | 6/2023 | Katkar et al. |
| 2023/0197655 | A1 | 6/2023 | Theil et al. |
| 2023/0207402 | A1 | 6/2023 | Fountain, Jr. et al. |
| 2023/0207437 | A1 | 6/2023 | Haba |
| 2023/0207474 | A1 | 6/2023 | Uzoh et al. |
| 2023/0207514 | A1 | 6/2023 | Gao et al. |
| 2023/0215836 | A1 | 7/2023 | Haba et al. |
| 2023/0245950 | A1 | 8/2023 | Haba et al. |
| 2023/0268300 | A1 | 8/2023 | Uzoh et al. |
| 2023/0343734 | A1 | 10/2023 | Uzoh et al. |
| 2023/0360950 | A1 | 11/2023 | Gao |
| 2023/0361074 | A1 | 11/2023 | Uzoh et al. |
| 2023/0369136 | A1 | 11/2023 | Uzoh et al. |
| 2024/0186269 | A1 | 6/2024 | Haba |
| 2025/0006642 | A1 | 1/2025 | Haba et al. |

FOREIGN PATENT DOCUMENTS

| | | | | |
|---|---|---|---|---|
| JP | 2000010814 | A | * | 1/2000 |
| JP | 2013-033786 | A | | 2/2013 |
| JP | 2018-160519 | | | 10/2018 |
| KR | 10-2020-0002557 | | | 1/2020 |
| WO | WO 2005/043584 | A2 | | 5/2005 |
| WO | WO 2021/198009 | A1 | | 10/2021 |

OTHER PUBLICATIONS

"Companies Review Costs to Update Working Capital Plans amid COVID-19 Crisis," Chiplets Market, Chiplets Market (Application: Microprocessors [MPUs], System-on-Chip [SOC] Device, Graphic Processing Units [GPUs], Programmable Logic Devices [PLDs], and Others; and End-use Industry; Automotive Electronics, Consumer Electronics, Industrial Automation, Healthcare, Military, IT & Telecommunication, and Others)—Global Industry Analysis, Size, Share, Growth, Trends, and Forecast, 2021-2031, Transparency Market Research, https://www.transparencymarketresearch.com/chiplets-market.html, printed Aug. 14, 2023, 7 pages.

Feige, C. et al., "Logic BIST technology evaluation: an industrial case study," European Test Workshop-Informal Digest, 2001, pp. 333-340.

International Search Report and Written Opinion mailed Nov. 22, 2023, International Application No. PCT/US2023/029749, 10 pages.

Nan, Li et al., "Logic BIST: State-of-the-Art and Open Problems," arXiv preprint arXiv: 1503.04628, 2015, 6 pages.

Vranken, Harald et al., "Impact of test point insertion on silicon area and timing during layout," Proceedings of the conference on Design, automation and test in Europe, Feb. 2004, vol. 2, ** pages.

Bush, Steve, "Electronica: Automotive power modules from On Semi," ElectronicsWeekly.com, indicating an OnSemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences-Nanoscience and Nanotechnology, 2010, 11 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1(I), 6 pages.

OnSemi AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the Bush article share the part number "OnSemi AR0820."

Plobi, A. et al., "Wafer direct bonding: tailoring adhesion between brittle materials," Materials Science and Engineering Review Journal, 1999, R25, 88 pages.

Sony IMX260 image, cross section of Sony dual-pixel sensor product labeled IMX260, showing peripheral probe and wire bond

(56) References Cited

OTHER PUBLICATIONS pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260."
AEHR Test Systems, "FOX™ WaferPak Contactor—Single Touch-down Full-Wafer Test & Burn-in", Publication 4083047601RevC, (2028) downloaded from https://www.aehr.com/wp-content/uploads/2023/09/FOX-WaferPak-3.2.18.pdf in 1 page.
Formfactor® Case Study "Radar IC Manufacturer Cuts Testing Time in Half, Regardless of Elevated Temperatures, Using InfinityQuad Probes," Danube Integrated Circuit Engineering (DICE); (2022) in 4 pages.
Kim B.H. et al., "A Robust MEMS Probe Card with Vertical Guide for a Fine Pitch Test," J. Micromech. Microeng. Jun. 11, 2007;17(7): 1350-1359.
Rayming Technologies., "Top Aviation Engineering Services Companies in the World and What they Offer," downloaded from https://www.raypcb.com/aviation-engineering-services/; (2023) in 10 pages.

* cited by examiner

BONDED DEBUGGING ELEMENTS FOR INTEGRATED CIRCUITS AND METHODS FOR DEBUGGING INTEGRATED CIRCUITS USING SAME

RELATED APPLICATIONS

This application claims the priority benefit of U.S. Provisional Patent Application 63/371,195 filed on Aug. 11, 2022, entitled "BONDED DEBUGGING ELEMENTS FOR INTEGRATED CIRCUITS AND METHODS FOR DEBUGGING INTEGRATED CIRCUITS USING SAME," which is incorporated by reference herein in its entirety.

BACKGROUND

Field of the Invention

The field relates to bonded debugging devices for integrated circuit chips, in particular bonded debugging elements that include debugging circuitry.

Description of the Related Art

Semiconductor devices, in particular system on a chip (SoC) devices, have increased in complexity while also decreasing in size and dimension. As SoC devices and other integrated circuit (IC) devices become more complex, the importance of debugging the SoC devices increases. However, it can be challenging to provide a debugging system that adequately debugs important functionalities of SoC and IC devices without the use of expensive high-speed logic and high-priced adapters to connect to denser SoC and IC chip packages. Accordingly, there exists a continuing demand for improved debugging devices, circuitries, and processes.

SUMMARY

For purposes of summarizing the disclosure and the advantages achieved over the prior art, certain objects and advantages of the disclosure are described herein. Not all such objects or advantages may be achieved in any particular embodiment. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

In one embodiment, an integrated circuit device can include: a first active circuitry in a device portion of the integrated circuit device; a first non-conductive layer over the device portion, the first non-conductive layer at least partially defining a direct bonding surface of the integrated circuitry device; and a trace line connected to the first active circuitry and extending at least partially into the first non-conductive layer, wherein the trace line is configured to provide electrical communication between the first active circuitry and a debugging chip, the trace line terminating at or below the direct bonding surface.

In some embodiments, the integrated circuit device can include a plurality of contact features at least partially embedded within the first non-conductive layer, the plurality of contact features configured to connect only to corresponding contact features of the debugging chip. In other embodiments, the integrated circuit device can further include the first non-conductive layer having a bonding surface prepared for direct hybrid bonding. In some embodiments, the plurality of contact features of the integrated circuit device can connect to the trace line. In some embodiments, the integrated circuit can include a second non-conductive layer over the first non-conductive layer. In some embodiments, the integrated circuit device can include the trace line terminating at or below a bonding surface of the integrated circuit device, the trace line not connected to a contact pad at the bonding surface of the integrated circuit device. In some embodiments, the integrated circuit device can include the first non-conductive layer having at least one dielectric layer. In some embodiments, the integrated circuit can include a second non-conductive layer over the trace lines.

In another embodiment, a bonded structure can include: the integrated circuit device; the bonded structure can further include a debugging element directly bonded to the integrated circuit device; wherein a first non-conductive layer of the integrated circuit device is directly bonded to a second non-conductive layer of the debugging element without an intervening adhesive; and wherein a first contact feature of the integrated circuit device is directly bonded to a second contact feature of the debugging element without an intervening adhesive.

In some embodiments, the debugging chip can be configured to debug the first active circuitry. In some embodiments, the debugging element includes a debugging circuitry. In some embodiments, the debugging circuitry can include a memory circuitry. In some embodiments, the second contact feature may not be in electrical communication with the first active circuitry. In some embodiments, the trace line can be electrically inactive. In other embodiments, the trace line can be further configured to connect to electrical power or ground.

In another embodiment, a bonded structure can include: an integrated circuit device having first active circuitry; and a debugging element comprising debugging circuitry, the debugging element directly bonded to the integrated circuit device without an adhesive along a bonding interface; wherein the debugging circuitry is configured to debug logic of first active circuitry of the integrated circuit device.

In some embodiments, the debugging element can include a chip. In some embodiments, the bonded structure can include a first non-conductive bonding layer of the integrated circuit device which can be directly bonded to a second non-conductive bonding layer of the debugging element without an intervening adhesive; and wherein a first contact feature of the integrated circuit device is directly bonded to a second contact feature of the debugging element without an intervening adhesive. In some embodiments, the bonded structure can include a majority of the first and second contact features can be configured to debug at least a portion of the first active circuitry of the integrated circuit device. In some embodiments, the bonded structure can include debugging at least a portion of the first active circuitry by: probing the first active circuitry so as to produce a one or more signals from the first active circuitry; collecting the one or more signals; storing the one or more signals; and analyzing the one or more signals. In some embodiments the debugging circuitry can be configured to transmit one or more signals to the first active circuitry. In some embodiments, the one or more signals can probe one or more portions of the first active circuitry. In some embodiments, the first active circuitry can emit one or more return signals such that the one or more return signals are conveyed from the first active circuitry to the debugging circuitry and the debugging circuitry is configured to analyze or store the one or more return signals. In some embodiments, the debugging circuitry can be configured to manipulate the one or more return signals.

In another embodiment, a method for debugging an integrated circuit device is disclosed. The method can include: directly bonding a debugging element to an integrated circuit device without an adhesive, the integrated circuit device comprising first active circuitry and the debugging element comprising a debugging circuitry; transmitting one or more signals from the debugging element to the first active circuitry; emitting one or more return signals from the active circuitry; conveying the one or more return signals from the active circuitry to the debugging circuitry; and storing the one or more return signals in the debugging circuitry.

In some embodiments, the method can include removing the debugging element from the integrated circuit device. In some embodiments, the method can further include removing the debugging element is performed by chemical mechanical polishing. In some embodiments, the method can include depositing a non-conductive layer on a surface of the integrated circuit device after removing the debugging element. In some embodiments, the method can include analyzing the one or more return signals. In some embodiments, the method can include manipulating the one or more return signals.

In another embodiment, a debugging chip can include: a debugging circuitry, wherein the debugging circuitry is configured to debug the circuitry of an element directly bonded to the debugging chip, wherein debugging the circuitry of the element comprises analyzing signals emitted from the element; and a bonding layer configured for direct hybrid bonding without an adhesive, the bonding layer comprising a non-conductive bonding layer and a plurality of contact features at least partially embedded within the non-conductive bonding layer.

In some embodiments, the debugging chip can be directly bonded to an integrated circuit device, without an adhesive, and wherein the integrated circuit device comprises an active circuitry. In other embodiments, the debugging circuitry can be configured to probe the active circuitry of the integrated circuit device. In some embodiments, the debugging circuitry can be configured to store signals produced from the active circuitry of the integrated circuit device. In some embodiments, the debugging circuitry can be configured to manipulate signals produced from the active circuitry of the integrated circuit device. In some embodiments, the debugging circuitry can be configured only to debug the circuitry of the element. In some embodiments, the debugging circuitry can be at least 50% of all circuitry of the debugging chip. In some embodiments, the debugging circuitry can be at least 90% of all circuitry of the debugging chip.

DETAILED DESCRIPTION OF THE PREFERRED EMBODIMENT

Figure 1:
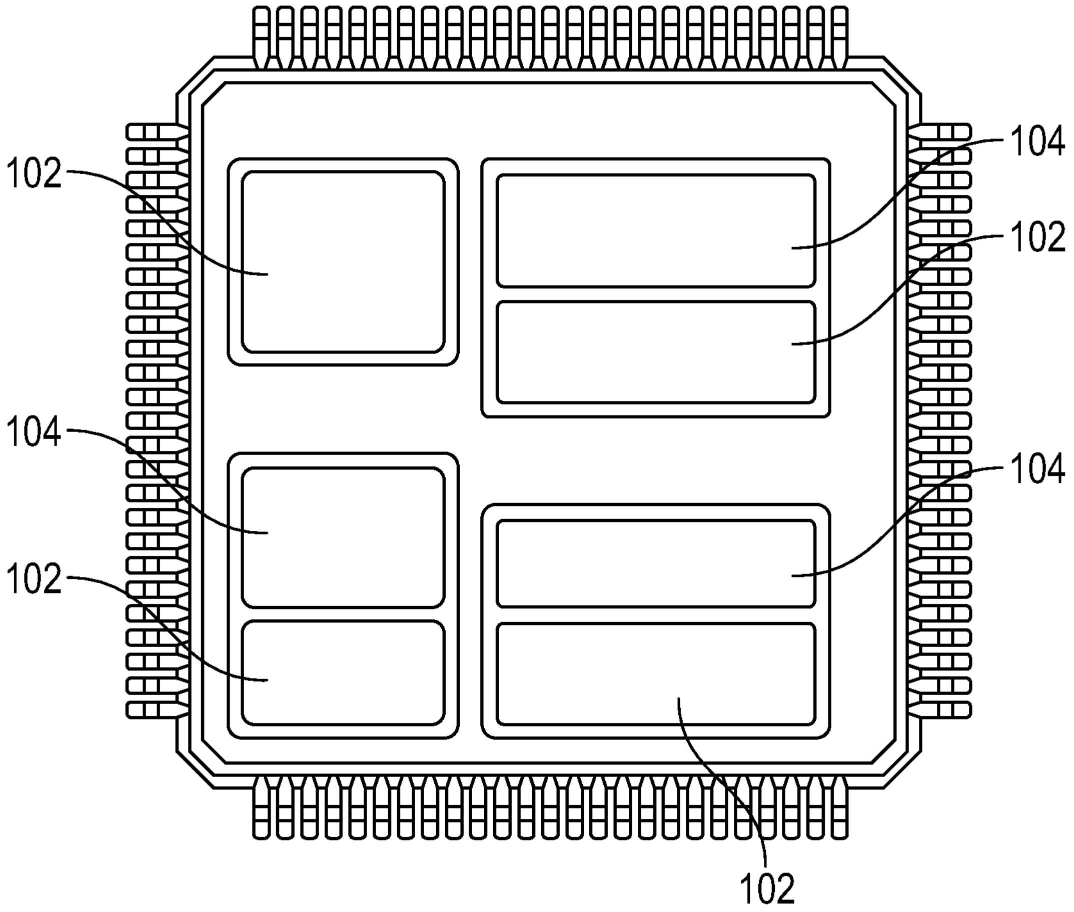
FIG. 1 is a schematic view showing conventional debugging circuitries integrated in SoC devices.

The present disclosure may be understood by reference to the following detailed description. It is noted that, for purposes of illustrative clarity, certain elements in various drawings may not be drawn to scale, may be represented schematically or conceptually, or otherwise may not correspond exactly to certain physical configurations of embodiments.

Embodiments relate to debugging elements for integrated circuit (IC) devices, e.g., system on a chip (SoC) devices. The debugging elements (e.g., debugging chips) of this disclosure may reduce the area of the IC or SoC devices that is used to perform debugging functions. This may be attributed to the debugging circuitries (e.g., debugging chips) being bonded to a suitable surface of the IC device, as opposed to being embedded within the chip (e.g., an IC device) to be tested. As explained herein, the debugging chips can be provided in a separate chip or chiplet that is directly bonded to an IC device, which can comprise a chip to be debugged.

Conventionally, debugging circuitries are widely used to debug IC devices using as small an area as possible. Generally, debugging circuitries (e.g., in-circuit emulators) are used to develop and debug the designs of IC devices. In particular, in conventional systems, embedded debugging circuitries are permanently part of the device which they are designed to debug. As a result, embedded debugging circuitries having a smaller footprint is advantageous, as they take up part of the IC device's footprint. While efforts have been made to place entire emulators with breakpoints and tracing capabilities on a debugging chip, the cost of such a chip using conventional technologies is prohibitively high. In particular, in complex chip design (e.g., Field Programmable Gate Arrays (FFPGA)) significant chip area may be devoted when using embedded debugging circuits. This large footprint may be caused by debugging circuitries used for identifying points to tapping into electronic signals, creation of these tapping points, connection of the FFPGA's chip memory to store electronic signals from the debugging circuitries, as well as separate logic circuits to trigger the start of storage and the offloading of this stored data. Due to the large amount of space used for these debugging circuitries, the number of connection points may be very limited. Moreover, after conventional debugging is completed, mass produced chips likely will still contain the debugging circuitry that is no longer useful. Previous attempts at off-chip debugging packages have relied on micro-bump chip interconnects of relatively low density. Using micro-bump chip interconnects may cause the debugging features of the package to suffer from speed limitations in complex devices, as the signals from the debugging package is routed over long distances to reach the proper device interconnects. Therefore, there is a need for a debugging chip with high functionality (e.g., a debugging circuitry that allows for debugging of complex systems like FFPGAs and other chips) that can quickly and efficiently debug complex devices without occupying large areas of the devices and which may be removed after initial design debugging is complete.

Various embodiments disclosed herein can utilize debugging chips which include a debugging circuitry. In some embodiments, the debugging chip may be bonded to the surface of an IC element (e.g., a chip or SoC). In some embodiments, the debugging chip may be bonded to conductive contact features (e.g., contact pads) on an IC element (e.g. a chip or SoC). In some embodiments, the pads on the IC element may be connected to a high density of tapping lines. In some embodiments, the debugging may occur on sample IC elements prior to mass-market production, and the debugging chip may not be part of the final mass-market product.

FIG. 1 is a schematic view of an IC device with a conventional in-device debugging circuitry 102 (e.g., one or more debugging logic blocks). On chip debugging is commonly used in the developmental stage of IC devices. In general, debugging circuitry 102, which may include a processing circuitry and/or a memory circuitry that stores software instructions that may be executed by the processing circuitry, allow developers a method for debugging IC device circuitries 104, which may include processing circuitries and memory circuitries, the memory circuitries configured to store software instructions that may be executed by the processing circuitries. As schematically shown, when debugging circuitry is included in the chip, the debugging circuitry interface to the live hardware is provided by additional blocks within the device's processor. Because the debugging circuitry and software 102 is built into the original device circuitries and software 104, they are generally not removed after initial debugging due to the danger of changing IC internal circuitries after testing but before mass production. However, leaving this unused debugging circuitry 102, which is no longer used in the mass-produced product, may needlessly increase the footprint of the device system while unnecessarily providing hackers and other third parties unwanted access (e.g., a backdoor) to the IC device. Because larger device footprints lead to lower device yields and backdoors endanger the safety and usefulness of IC devices, there is a motivation to remove as much unneeded debugging circuitry 102 as possible in final mass-produced device.

Hardware and software debugging in conventional IC devices (e.g., chips) is generally performed in different layers. Modern IC devices often feature multiple processor cores and blocks for graphics, application acceleration, high-speed, low speed, and general peripherals. The blocks may be connected through a hierarchy of SoC interconnects, and the chip may be connected to a printed circuit board. Conventionally, validation, and/or debugging, is performed by designers using transaction level simulation in virtual prototypes. Acceleration and/or emulation may also be useful, as well as graphics-based prototyping. Debugging itself may be performed in layers. Firstly, the hardware of a chip may be debugged and/or verified, this may be performed on individual IP blocks, subsystems, as well as on the actual SoC. Similarly, bare metal software executing at the lowest level of extraction may also be verified by debugging circuitries. More complex systems may also be debugged by debugging circuitries. For instance, debugging circuitries may also be used to debug and verify the operating system, including specific functions and/or package interfaces that are proved by the operating systems. Debugging circuitries may also validate key parameters, like performance and power on upper levels of the circuitry. Importantly, debugging circuitries may be designed to test application scenarios such as usage and/or power needs of the system and/or system interface. As such, debugging of complex systems may validate all or some of the functionalities of a SoC or other device, including the base hardware to top level operating system functionalities.

Figure 2A:
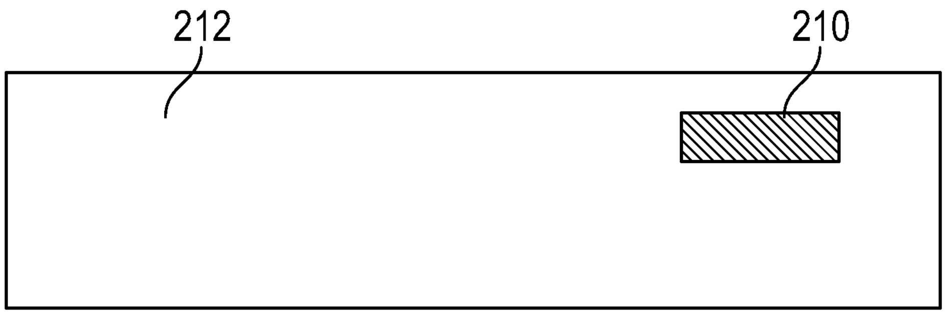
FIG. 2A a is a schematic side view of a debugging circuitry embedded in an IC element.

FIGS. 2A-E illustrate schematic representations of debugging circuitries and devices. FIG. 2A illustrates a conventional embedded debugging circuitry or device 210. In conventional embedded debugging circuitries 210, the embedded debugging circuitry 210 can be embedded into the IC device 212. For example, the debugging circuitry 210 can be patterned into a semiconductor die that comprises the IC device 212. As such, this embedded debugging circuitry 210 has a high degree of functionality (e.g., it may debug IC 212 devices), but the embedded debugging circuitry 210 may also take up a portion of the space of the IC device 212. Moreover, in IC devices 212, the embedded debugging circuitry 210 may be complex and/or expensive to make. Moreover, once the IC device 212 is verified (e.g., tested and debugged) and mass-produced, embedded debugging circuitry 210 cannot be removed from the IC device 212 architecture.

Figure 2B:
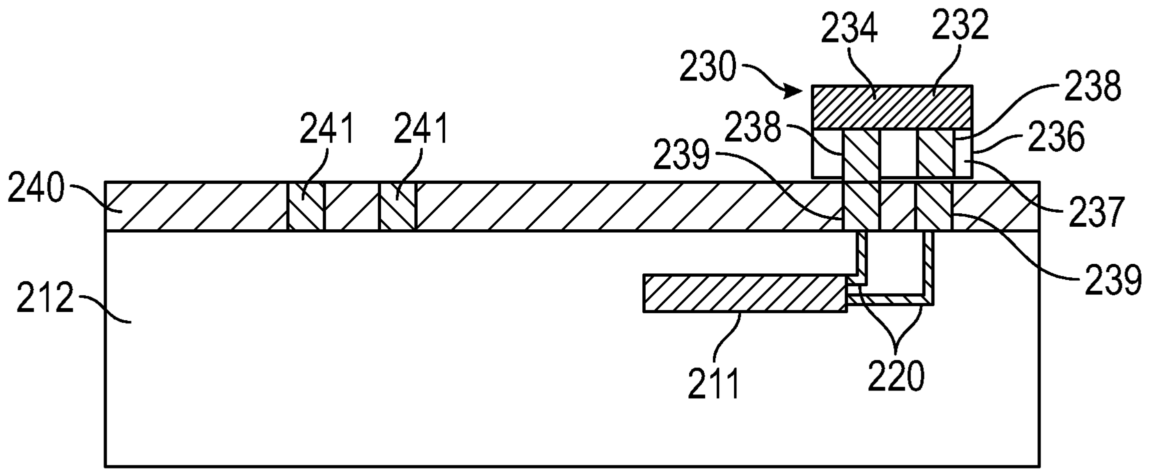
FIG. 2B is a schematic side view of a debugging circuitry outside of an IC element in a debugging chip, according to one embodiment.

FIG. 2B illustrates a schematic representation of debugging chip 230 directly bonded to an IC device 212 without an adhesive. In some embodiments, the debugging chip 230 can comprise a substrate 232 (e.g., formed of a semiconductor, such as silicon), a debugging circuitry 234 patterned in a portion of the substrate 232, and a debugging chip bonding layer (e.g., a bonding layer 236). Debugging chip 230 can be configured to debug the hardware and/or software of IC device 212. In various embodiments, the debugging chip 230 can be configured to only debug the hardware and/or software of the IC device 212. For example, at least 50%, at least 75%, at least 90%, at least 95%, or at least 99% of all circuitry of the debugging chip 230 can be configured for debugging the IC device 212. In some embodiments, the debugging chip 230 may not include any circuitry that is not configured to assist in debugging the IC device 212. In other embodiments, the debugging chip 230 may comprise mostly circuitry configured to assist in debugging the IC device 212. For example, more than half of the circuitry of the debugging chip 230 may be configured to debug the IC device 212, and less than half of any circuitry of the debugging chip 230 may be configured for other functions.

The bonding layer 236 can include a non-conductive (e.g., dielectric) layer 237 and a plurality of conductive contacts 238. Although FIG. 2B schematically illustrates debugging chip bonding layer 236 as a single layer, it should be appreciated that layer 236 can comprise multiple layer and/or sub-layers. A plurality of conductive contacts 238 may be at least partially embedded in bonding layer 236. In some embodiments, the IC device 212 can comprise a device portion containing an active circuitry 211 and an IC bonding surface (e.g., a bonding layer) which may comprise a non-conductive (e.g., dielectric, back-end-of-line) layer 240 and a plurality of conductive contacts 239 and 241 at least partially embedded in the dielectric layer 240. The plurality of conductive contacts 239 (e.g., debugging pads) may be electrically connected via trace lines (e.g., routing lines, debugging trace lines, debugging routing lines, etc.) 220 to the active circuitry 211. The plurality of conductive contacts 241 may comprise a power, a ground, and/or signal interconnections configured to connect to the IC device 212. IC device 212 may comprise a semiconductor device. The trace lines 220 may be at least partially embedded within the non-conductive layer 240, they may terminate within non-conductive layer 240, or they may extend to an upper surface of non-conductive layer 240. Although FIG. 2B schematically illustrates IC bonding layer 240 as a single layer, it should be appreciated that layer 240 can comprise multiple layers and/or sub-layers. In some embodiments, the debugging chip 230 may be directly hybrid bonded to the IC device 211. In some embodiments, the debugging chip bonding layer 236 is directly bonded to the IC bonding surface 240. In a hybrid bonding configuration, non-conductive dielectric layers 236 and 240 are directly bonded without an adhesive and opposing contacts 238 and 239 are directly bonded without an adhesive.

In some embodiments, the debugging chip 230 can be configured to test some or all of the functionality of active circuitry 211 of the IC device 212. For example, in some operations, the debugging circuitry 234 can be configured to transmit one or more signals to the active circuitry (e.g., one or more transistors) through the directly bonded conductive contact pads 238 and 239 of the debugging chip 230 and the IC device 212. The transmitted signal(s) can probe portions of the active circuitry (e.g., one or more transistors to be probed or tested, or one or more software packets to be run or tested), and the tested active circuitry can emit one or more return signals that are conveyed from the IC device 212 to the debugging circuitry 234 of the debugging chip 230 by way of the contact pads 238 and 239 of the bonding layers. The one or more return signals can be processed by the debugging circuitry 234, which can be programmed to determine whether the active circuitry of the IC device 212 is functional or non-functional. The one or more return signals can also be saved by an internal memory of the debugging chip 230. The debugging chip 230 can transmit an indication signal to the IC device 212 and/or to an external device (e.g., a package and/or system board) indicating the programming of the active circuitry (e.g., whether the tested circuit(s) or the tested software instructions are functional or non-functional). The debugging chip 230 can store the one or more return signals which may be retrieved by a testing engineer or external testing system.

As compared to conventional debugging circuitries, debugging chip 230 may use a high density of connections 238 to connect from debug tap points within the debug circuitry 234 directly to the direct bonding layer 236. Beneficially, the use of direct hybrid bonding techniques can enable high-density interconnections for debugging multiple channels of the IC device 212. Debugging chip 230 may comprise a memory and logic configured to store, manipulate, and/or analyze signals. In some embodiments, debugging chip 230 may comprise a memory for storage of signal data and logic for control an analysis of signal data. In some embodiments, debugging chip 230 may comprise an FPGA logic device.

In some embodiments, the debugging chip 230 is configured to collect data from the IC device 212. In some embodiments, the debugging chip 230 is configured to debug IC device 212. In some embodiments, debugging IC device 212 comprises storing data collected from signals produced by IC device 212. In some embodiments, debugging IC device 212 comprises analyzing and/or manipulating signals produced by IC device 212 to determine whether the circuitry is programmed appropriately (e.g., to debug the circuitry 211). For example, in various embodiments, the debugging chip 230 can be programmed to send signal packets to the IC device 212 and to await a response from the IC device 212. The packet response from the IC device 212 can be compared to an expected response without a predetermined margin. The debugging chip 230 can store the response in its memory and alert the user of any discrepancy. The discrepancies can be stored in the debugging chip 230 for review by the user, or the sequences of packets can be uploaded to another device accessible by the user. When the debugging processes are complete, the user can review the discrepancies and repair any defects in the IC device 212.

In some embodiments, connections 238 may comprise a power, a ground, and/or signal interconnections configured to control the debugging process on the IC device 212. In some embodiments, the density of connections 238 may be significantly high. For example, in various embodiments, the connections 238 can comprise a pitch of less than 50 microns, less than 20 microns, less than 10 microns, less than 5 microns, or less than 1 micron. The density of connections 238 can be several hundred times denser than conventional solder ball connections.

Figure 2C:
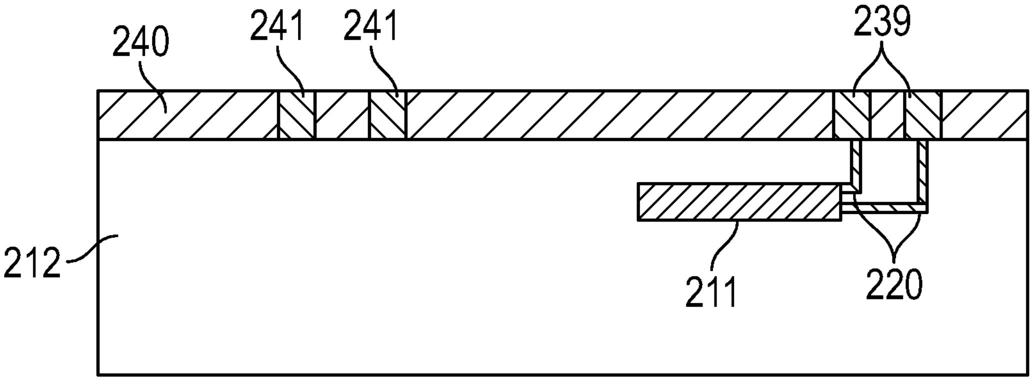
FIG. 2C is a schematic side sectional view of an IC device configured for direct bonding, according to one embodiment.

Accordingly, as explained herein in connection with FIG. 2B, the debugging chip 230 may be bonded to the IC device 212 to verify that the circuitry patterned in device 212 is adequately debugged. The debugging process may be applied to a set of debugging chips before a production run. Accordingly, in some embodiments, as shown in FIG. 2C, if the IC device 212 has been debugged, the debugging chip 230 may be omitted during manufacturing of the IC device 212 for production. In conventional debugging circuitries, the debugging circuitry is included in the architectural design of a chip or device. Therefore, in conventional devices, as depicted in FIG. 2A, the debugging circuitry may not be removed after debugging, because removing the debugging circuitry may necessitate a redesign of the device architecture. However, in some embodiments, the debugging chip 230 of FIG. 2B may be omitted from the device 212 because, during debugging, the debugging chip is bonded to the IC device 212 and not integral to the IC device 212. Omitting the debugging chip 230 from the mass-produced device during manufacturing may expose contacts 239 (e.g., debugging pads) which may be connected to the circuitry 211 via trace lines 220 (e.g., the contact features 239 may be configured to connect only to corresponding conductive features of a debugging chip 230). In some embodiments, omitting the debugging chip 230 may comprise not bonding the debugging chip 230 to the IC device 212 during manufacturing. In some embodiments, omitting debugging chip 230 prior to production may not necessitate a redesign of the IC device 212. In some embodiments, omitting the debugging chip 230 may leave debugging pads 239 exposed at the bonding surface and which may be connected to the underlying debugging traces 220 which connect to the active circuitry 211. In other embodiments, the debugging chip 230 may at least partially removed from the IC device 212 after debugging. For instance, using chemical mechanical polishing, the debugging chip 230 may be polished off IC device 212. In some embodiments, the debugging pads 239 may be configured to connect to a debugging chip (e.g., only to a debugging chip and not to other types of chips), but in production devices, the debugging pads 239 may not be connected to another chip but may remain exposed at the external surface of the IC device 212 in some embodiments. In other embodiments, the debugging pads 239 may be bonded to opposing contacts on another device or chip, but the debugging pads 239 may be electrically inactive in the bonded device (e.g., in the bonded device, the debugging pads 239 may serve as dummy pads that do not convey electrical signals or power to the opposing pads). In other embodiments, the debugging pads 239 may not convey signals but may instead connect to power and/or ground. In other embodiments, the debugging pads 239 can be buried underneath another non-conductive layer formed over the pads 239.

Figure 2D:
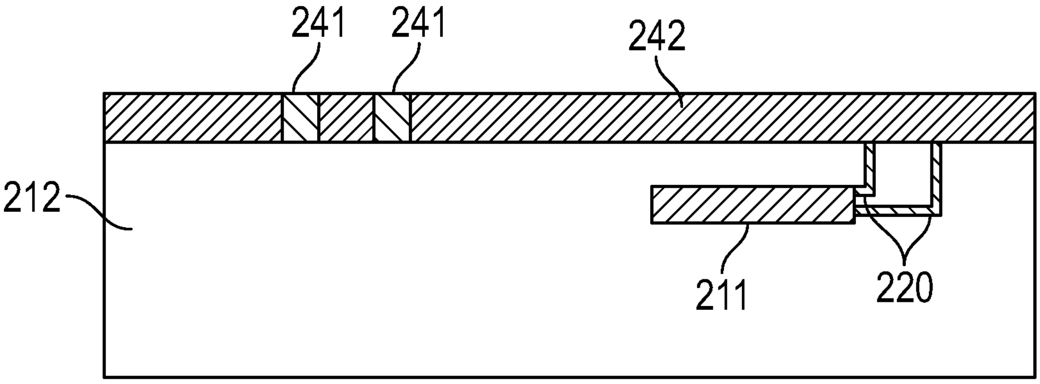
FIG. 2D is a schematic side sectional view of a debugged IC device, according to one embodiment.

FIG. 2D illustrates a debugged chip structure, according to some embodiments. After debugging is performed in pre-market IC devices 212, in production-run IC devices 212, IC bonding layer 240, and debugging pads 239 may be omitted from the IC device 212 as well. Omitting IC bonding layer 240 and debugging pads 239 may comprise not patterning IC bonding layer 240 or debugging pads 238 in the production-run IC device 212. Advantageously, omitting IC bonding layer 240 and debugging pads 239 may not necessitate a chip redesign prior to productions. In some embodiments, during production runs of IC device 212, trace lines 220 will remain connected to active circuitry 211. However, unlike in FIG. 2C, in FIG. 2D, trace lines 220 may not be connected to a plurality of debugging pads 239 but may instead terminate at or in one or more back-end-of-line (BEOL) layers. In some embodiments, a non-conductive layer 242 (e.g., a back-end-of-line (BEOL) layer) may be deposited over the trace lines 220. In some embodiments, a plurality of contact pads 241 may be at least partially embedded into non-conductive layer 242. In some embodiments, the plurality of contact pads 241 may comprise power, ground, and/or signal interconnections to connect functional circuitry of the IC device 212 to another element to which the IC device 212 is to be directly bonded. In some embodiments, the plurality of contact pads 241 may not be connected to the trace lines 220. In some embodiments trace lines 220 may be patterned within non-conductive layer 242. In some embodiments, trace lines 220 may terminate below the non-conductive layer 242. In some embodiments, trace lines 220 are disconnected from other circuitry (not pictured). In some embodiments, trace lines 220 may be disconnected from active circuitry 211. In some embodiments, trace lines 220 may be electrically inactive (e.g., disconnected from other circuitries). In various embodiments, the trace lines 220 can terminate at or below a bonding surface of the IC device 212, and the trace lines 220 may not be connected to a contact pad at the bonding surface of the IC device 212.

Figure 2E:
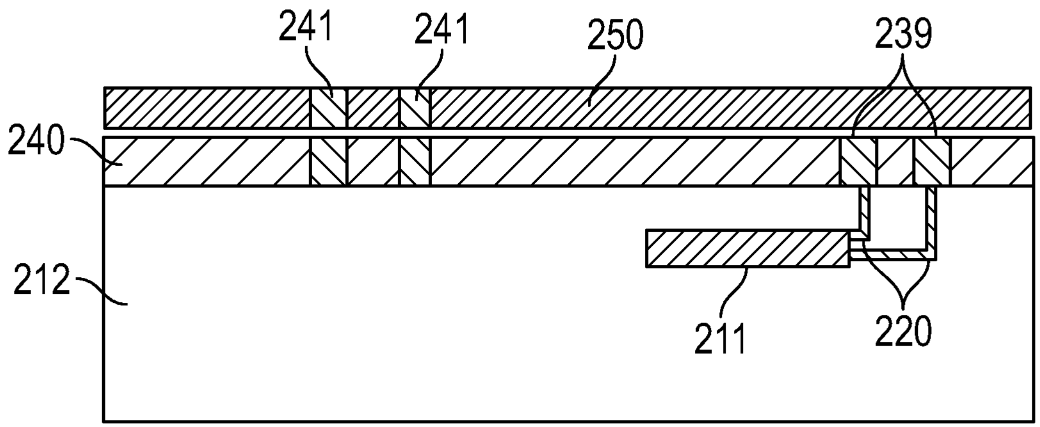
FIG. 2E is a schematic side sectional view of an IC device, according to another embodiment.

FIG. 2E illustrates, a debugged chip structure, according to some embodiments. Similarly to FIG. 2D, after debugging is performed in pre-market IC devices 212, in production-run IC devices 212, the debugging chip 230 may not be bonded to the IC device 212. Unlike in FIG. 2D, in which the IC bonding layer 240 was omitted from the mass-market IC device 212, in FIG. 2E, a non-conductive layer 250 may be deposited over bonding layer 240 and covering debugging pads 239. In some embodiments, covering the debugging pads 239 may inhibit electrical access to the debugging pads 239. In some embodiments, non-conductive layer 250 may be one or more dielectric layers. In some embodiments, a plurality of conductive pads 241 may be at least partially embedded in non-conductive layer 250 and bonding layer 240. The plurality of conductive pads 241 may comprise power, ground, and/or signal interconnections configured to connect to the IC device 212. In some embodiments, conductive pads 241 do not connect to the trace lines 220.

Figure 3:
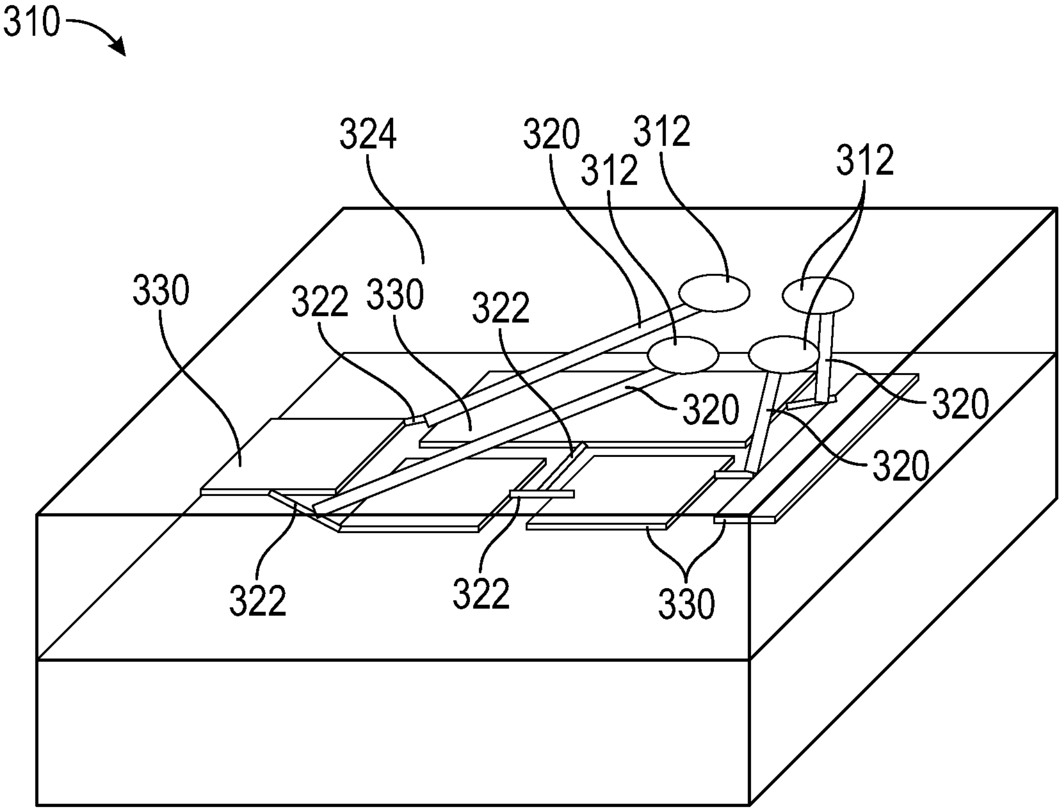
FIG. 3 is a schematic view of an IC device with direct bonding pads, according to another embodiment.

FIG. 3 illustrates an IC device 310 configured for direct bonding to a debugging element. IC device 310 has electrical contact pads (e.g., debugging pads) 312 on a surface of the IC device 310. Debugging pads 312 can be configured for direct bonding to a debugging chip (not shown). The debugging pads 312 are electrically connected to conductive traces 320 embedded in a routing layer 324 provided over active circuitry 330. Tracing lines 320 are connected to tap lines 322. Tap lines 322 are electrical connections that connect different circuitry blocks 330 of the IC device 310. After debugging of the IC device 310, debugging pads 312 may remain exposed. As previously described, a non-conductive layer (not pictured) may be deposited over debugging pads 312, thereby limiting access to debugging pads 312 from outside of the IC device 310. As previously disclosed, in the production device, debugging pads 312 may not be included, exposing the trace lines 320. In some embodiments, a non-conductive layer may be deposited over the exposed trace lines 320. In some embodiments, the non-conductive layer may be one or more back end of line layers. In some embodiments, the trace lines 320 may be embedded at least partially in the non-conductive (e.g., back end of line) layer and/or layers 324. In some embodiments, the non-conductive layer or layers 324 may be formed over the trace lines 320.

Various embodiments disclosed herein relate to directly bonded structures in which two elements (e.g., an IC device, SoC device, semiconductor device, a debugging chip, etc.) can be directly bonded to one another without an intervening adhesive. A directly bonded structure comprises two elements that can be directly bonded to one another without an intervening adhesive. Two or more semiconductor elements (such as integrated device dies, wafers, IC devices and elements, debugging chips, SoCs, etc.) may be stacked on or bonded to one another to form a bonded structure. Conductive contact pads of a first element may be electrically connected to corresponding conductive contact pads of a second element. Any suitable number of elements can be stacked in the bonded structure. For example, a third element can be stacked on the second element, a fourth element can be stacked on the third element, and so forth. Additionally or alternatively, one or more additional elements can be stacked laterally adjacent one another along the first element. In some embodiments, the laterally stacked additional element may be smaller than the second element. In some embodiments, the laterally stacked additional element may be two times smaller than the second element.

Figure 4A:
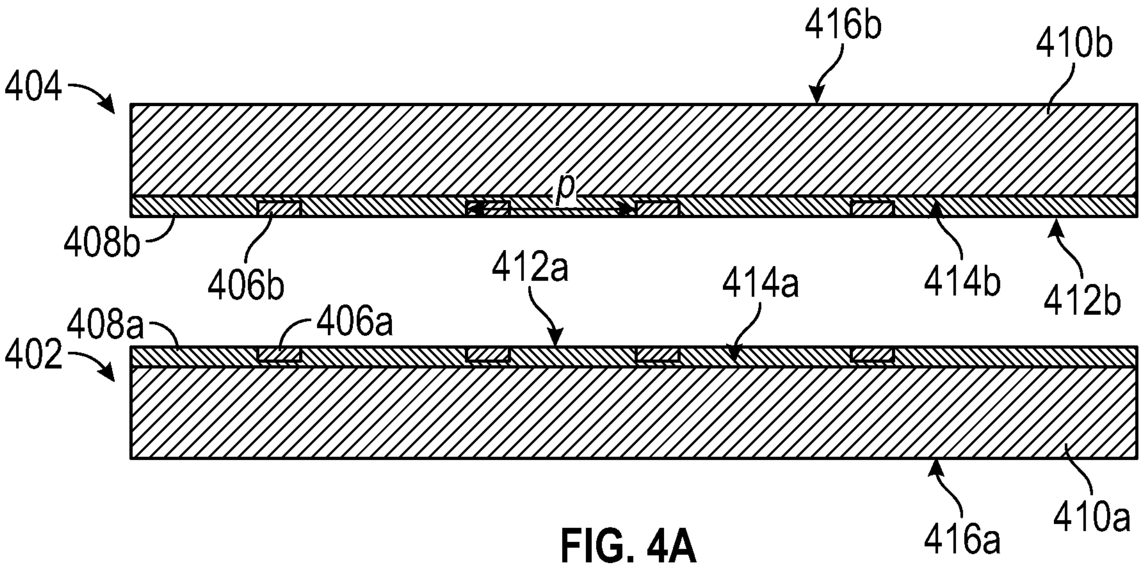
FIG. 4A is a schematic cross-sectional side view of two elements prior to direct hybrid bonding.
Figure 4B:
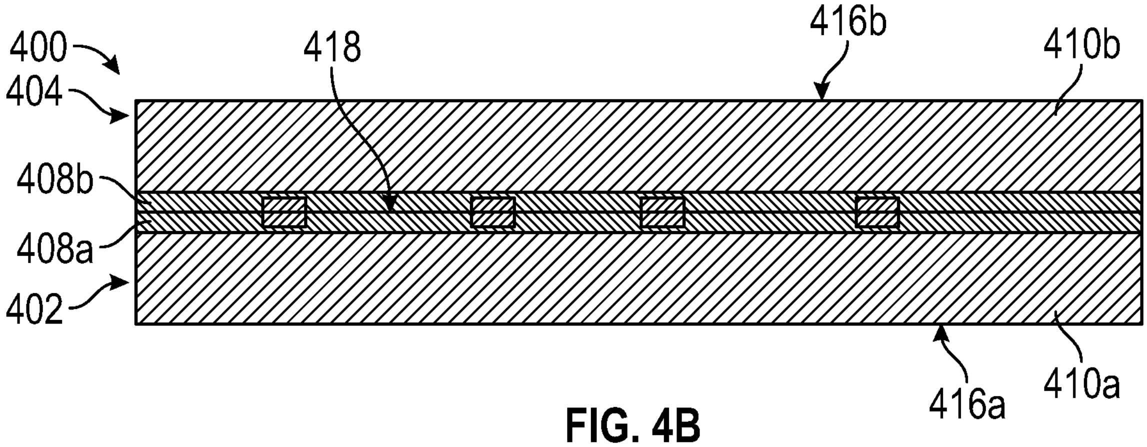
FIG. 4B is a schematic cross-sectional side view of a bonded structure including the two elements shown in FIG. 4A after direct hybrid bonding.

FIGS. 4A and 4B schematically illustrate a process for forming a hybrid bonded structure without an intervening adhesive (which may sometimes be referred to as a "direct hybrid bonded structure") according to some implementations. As used herein, the term "hybrid bonding" refers to a species of direct bonding in which there are both i) nonconductive features directly bonded to nonconductive features, and ii) conductive features directly bonded to conductive features. In FIGS. 4A and 4B, a bonded structure 400 comprises two elements 402 and 404 that can be directly bonded to one another at a bond interface 418 without an intervening adhesive. Two or more microelectronic elements 402 and 404 (such as semiconductor elements, including, for example, integrated device dies, wafers, passive devices, individual active devices such as power switches, etc.) may be stacked on or bonded to one another to form the bonded structure 400. Conductive features 406*a* (e.g., contact pads, exposed ends of vias (e.g., TSVs), or a through substrate electrodes) of a first element 402 may be electrically connected to corresponding conductive features 406*b* of a second element 404. Any suitable number of elements can be stacked in the bonded structure 400. For example, a third element (not shown) can be stacked on the second element 404, a fourth element (not shown) can be stacked on the third element, and so forth. Additionally or alternatively, one or more additional elements (not shown) can be stacked laterally adjacent one another along the first element 402. In some implementations, the laterally stacked additional element may be smaller than the second element. In some implementations, the laterally stacked additional element may be two times smaller than the second element.

In some implementations, the elements 402 and 404 are directly bonded to one another without an intervening adhesive. In various implementations, a non-conductive field region that includes a non-conductive or dielectric material can serve as a first bonding layer 408*a* of the first element 402 which can be directly bonded to a corresponding non-conductive field region that includes a non-conductive or dielectric material serving as a second bonding layer 408*b* of the second element 404 without an intervening adhesive. The non-conductive bonding layers 408*a* and 408*b* can be disposed on respective front sides 414*a* and 414*b* of device portions 410*a* and 410*b*, such as a semiconductor (e.g., silicon) portion of the elements 402, 404. Active devices and/or circuitry can be patterned and/or otherwise disposed in or on the device portions 410*a* and 410*b*. Active devices and/or circuitry can be disposed at or near the front sides 414*a* and 414*b* of the device portions 410*a* and 410*b*, and/or at or near opposite backsides 416*a* and 416*b* of the device portions 410*a* and 410*b*. Bonding layers can be provided on front sides and/or back sides of the elements. The non-conductive material can be referred to as a non-conductive bonding region or bonding layer 408*a* of the first element 402. In some implementations, the non-conductive bonding layer 408*a* of the first element 402 can be directly bonded to the corresponding non-conductive bonding layer 408*b* of the second element 404 using dielectric-to-dielectric bonding techniques. For example, non-conductive or dielectric-to-dielectric bonds may be formed without an intervening adhesive using the direct bonding techniques disclosed at least in U.S. Pat. Nos. 9,464,414; 9,391,143; and 10,434,749, the entire contents of each of which are incorporated by reference herein in their entirety and for all purposes. It should be appreciated that in various implementations, the bonding layers 408*a* and/or 408*b* can comprise a non-conductive material such as a dielectric material, such as silicon oxide, or an undoped semiconductor material, such as undoped silicon. Suitable dielectric bonding surface or materials for direct bonding include but are not limited to inorganic dielectrics, such as silicon oxide, silicon nitride, or silicon oxynitride, or can include carbon, such as silicon carbide, silicon oxycarbonitride, low K dielectric materials, SiCOH dielectrics, silicon carbonitride or diamond-like carbon or a material comprising a diamond surface. Such carbon-containing ceramic materials can be considered inorganic, despite the inclusion of carbon. In some implementations, the dielectric materials do not comprise polymer materials, such as epoxy, resin or molding materials.

In some implementations, the device portions 410*a* and 410*b* can have a significantly different coefficients of thermal expansion (CTEs) defining a heterogenous structure. The CTE difference between the device portions 410*a* and 410*b*, and particularly between bulk semiconductor, typically single crystal portions of the device portions 410*a*, 410*b*, can be greater than 5 ppm or greater than 10 ppm. For example, the CTE difference between the device portions 410*a* and 410*b* can be in a range of 5 ppm to 100 ppm, 5 ppm to 40 ppm, 10 ppm to 100 ppm, or 10 ppm to 40 ppm. In some implementations, one of the device portions 410*a* and 410*b* can comprise optoelectronic single crystal materials, including perovskite materials, that are useful for optical piezoelectric or pyroelectric applications, and the other of the device portions 410*a*, 410*b* comprises a more conventional substrate material. For example, one of the device portions 410*a*, 410*b* comprises lithium tantalate (LiTaO3) or lithium niobate (LiNbO3), and the other one of the device portions 410*a*, 410*b* comprises silicon (Si), quartz, fused silica glass, sapphire, or a glass. In other implementations, one of the device portions 410*a* and 410*b* comprises a III-V single semiconductor material, such as gallium arsenide (GaAs) or gallium nitride (GaN), and the other one of the device portions 410*a* and 410*b* can comprise a non-III-V semiconductor material, such as silicon (Si), or can comprise other materials with similar CTE, such as quartz, fused silica glass, sapphire, or a glass.

In various implementations, direct hybrid bonds can be formed without an intervening adhesive. For example, non-conductive bonding surfaces 412*a* and 412*b* can be polished to a high degree of smoothness. The nonconductive bonding surfaces 412*a* and 412*b* can be polished using, for example, chemical mechanical polishing (CMP). The roughness of the polished bonding surfaces 412*a* and 412*b* can be less than 30 Å rms. For example, the roughness of the bonding surfaces 412*a* and 412*b* can be in a range of about 0.1 Å rms to 15 Å rms, 0.5 Å rms to 10 Å rms, or 1 Å rms to 5 Å rms. The bonding surfaces 412*a* and 412*b* can be cleaned and exposed to a plasma and/or etchants to activate the surfaces 412*a* and 412*b*. In some implementations, the surfaces 412*a* and 412*b* can be terminated with a species after activation or during activation (e.g., during the plasma and/or etch processes). Without being limited by theory, in some implementations, the activation process can be performed to break chemical bonds at the bonding surfaces 412*a* and 412*b*, and the termination process can provide additional chemical species at the bonding surfaces 412*a* and 412*b* that improves the bonding energy during direct bonding. In some implementations, the activation and termination are provided in the same step, e.g., a plasma to activate and terminate the surfaces 412*a* and 412*b*. In other implementations, the bonding surfaces 412*a* and 412*b* can be terminated in a separate treatment to provide the additional species for direct bonding. In various implementations, the terminating species can comprise nitrogen. For example, in some implementations, the bonding surface(s) 412*a*, 412*b* can be exposed to a nitrogen-containing plasma. Further, in some implementations, the bonding surfaces 412*a* and 412*b* can be exposed to fluorine. For example, there may be one or multiple fluorine peaks at or near a bond interface 418 between the first and second elements 402, 404. Thus, in the directly bonded structure 400, the bond interface 418 between two non-conductive materials (e.g., the bonding layers 408*a* and 408*b*) can comprise a very smooth interface with higher nitrogen content and/or fluorine peaks at the bond interface 418. Additional examples of activation and/or termination treatments may be found throughout U.S. Pat. Nos. 9,464,414; 9,391,143; and 10,434,749, the entire contents of each of which are incorporated by reference herein in their entirety and for all purposes. The roughness of the polished bonding surfaces 412*a* and 412*b* can be slightly rougher (e.g., about 1 Å rms to 30 Å rms, 3 Å rms to 20 Å rms, or possibly rougher) after an activation process.

In various implementations, conductive features 406*a* of the first element 402 can also be directly bonded to corresponding conductive features 406*b* of the second element 404. For example, a direct hybrid bonding technique can be used to provide conductor-to-conductor direct bonds along the bond interface 418 that includes covalently direct bonded non-conductive-to-non-conductive (e.g., dielectric-to-dielectric) surfaces, prepared as described above. In various implementations, the conductor-to-conductor (e.g., conductive feature 406*a* to conductive feature 406*b*) direct bonds and the dielectric-to-dielectric hybrid bonds can be formed using the direct bonding techniques disclosed at least in U.S. Pat. Nos. 9,716,033 and 9,452,988, the entire contents of each of which are incorporated by reference herein in their entirety and for all purposes. In direct hybrid bonding implementations described herein, conductive features are provided within non-conductive bonding layers, and both conductive and nonconductive features are prepared for direct bonding, such as by the planarization, activation and/or termination treatments described above. Thus, the bonding surface prepared for direct bonding includes both conductive and non-conductive features.

For example, non-conductive (e.g., dielectric) bonding surfaces 412*a*, 412*b* (e.g., inorganic dielectric surfaces) can be prepared and directly bonded to one another without an intervening adhesive as explained above. Conductive contact features (e.g., conductive features 406*a* and 406*b* which may be at least partially surrounded by non-conductive dielectric field regions within the bonding layers 408*a*, 408*b*) may also directly bond to one another without an intervening adhesive. In various implementations, the conductive features 406*a*, 406*b* can comprise discrete pads or traces at least partially embedded in the non-conductive field regions. In some implementations, the conductive contact features can comprise exposed contact surfaces of through substrate vias (e.g., through silicon vias (TSVs)). In some implementations, the respective conductive features 406*a* and 406*b* can be recessed below exterior (e.g., upper) surfaces (non-conductive bonding surfaces 412*a* and 412*b*) of the dielectric field region or non-conductive bonding layers 408*a* and 408*b*, for example, recessed by less than 30 nm, less than 20 nm, less than 15 nm, or less than 10 nm, for example, recessed in a range of 2 nm to 20 nm, or in a range of 4 nm to 10 nm. In various implementations, prior to direct bonding, the recesses in the opposing elements can be sized such that the total gap between opposing contact pads is less than 15 nm, or less than 10 nm. The non-conductive bonding layers 408*a* and 408*b* can be directly bonded to one another without an adhesive at room temperature in some implementations and, subsequently, the bonded structure 400 can be annealed. Upon annealing, the conductive features 406*a* and 406*b* can expand and contact one another to form a metal-to-metal direct bond. Beneficially, the use of Direct Bond Interconnect, or DBI®, techniques commercially available from Adeia of San Jose, CA, can enable high density of conductive features 406*a* and 406*b* to be connected across the direct bond interface 418 (e.g., small or fine pitches for regular arrays). In some implementations, the pitch of the conductive features 406*a* and 406*b*, such as conductive traces embedded in the bonding surface of one of the bonded elements, may be less than 100 microns or less than 10 microns or even less than 2 microns. For some applications, the ratio of the pitch of the conductive features 406*a* and 406*b* to one of the dimensions (e.g., a diameter) of the bonding pad is less than is less than 20, or less than 10, or less than 5, or less than 3 and sometimes desirably less than 2. In other applications, the width of the conductive traces embedded in the bonding surface of one of the bonded elements may range between 0.3 to 20 microns, e.g., in a range of 0.3 to 3 microns. In various implementations, the conductive features 406*a* and 406*b* and/or traces can comprise copper or copper alloys, although other metals may be suitable. For example, the conductive features disclosed herein, such as the conductive features 406*a* and 406*b*, can comprise fine-grain metal (e.g., a fine-grain copper).

Thus, in direct bonding processes, a first element 402 can be directly bonded to a second element 404 without an intervening adhesive. In some arrangements, the first element 402 can comprise a singulated element, such as a singulated integrated device die. In other arrangements, the first element 402 can comprise a carrier or substrate (e.g., a wafer) that includes a plurality (e.g., tens, hundreds, or more) of device regions that, when singulated, form a plurality of integrated device dies. Similarly, the second element 404 can comprise a singulated element, such as a singulated integrated device die. In other arrangements, the second element 404 can comprise a carrier or substrate (e.g., a wafer). The implementations disclosed herein can accordingly apply to wafer-to-wafer (W2 W), die-to-die (D2D), or die-to-wafer (D2 W) bonding processes. In wafer-to-wafer (W2 W) processes, two or more wafers can be directly bonded to one another (e.g., direct hybrid bonded) and singulated using a suitable singulation process. After singulation, side edges of the singulated structure (e.g., the side edges of the two bonded elements) may be substantially flush and may include markings indicative of the common singulation process for the bonded structure (e.g., saw markings if a saw singulation process is used).

As explained herein, the first and second elements 402 and 404 can be directly bonded to one another without an adhesive, which is different from a deposition process and results in a structurally different interface compared to a deposition. In one application, a width of the first element 402 in the bonded structure is similar to a width of the second element 404. In some other implementations, a width of the first element 402 in the bonded structure 400 is different from a width of the second element 404. Similarly, the width or area of the larger element in the bonded structure may be at least 10% larger than the width or area of the smaller element. The first and second elements 402 and 404 can accordingly comprise non-deposited elements. Further, directly bonded structures 400, unlike deposited layers, can include a defect region along the bond interface 418 in which nanometer-scale voids (nanovoids) are present. The nanovoids may be formed due to activation of the bonding surfaces 412*a* and 412*b* (e.g., exposure to a plasma). As explained above, the bond interface 418 can include concentration of materials from the activation and/or last chemical treatment processes. For example, in implementations that utilize a nitrogen plasma for activation, a nitrogen peak can be formed at the bond interface 418. The nitrogen peak can be detectable using secondary ion mass spectroscopy (SIMS) techniques. In various implementations, for example, a nitrogen termination treatment (e.g., exposing the bonding surface to a nitrogen-containing plasma) can replace OH groups of a hydrolyzed (OH-terminated) surface with NH2 molecules, yielding a nitrogen-terminated surface. In implementations that utilize an oxygen plasma for activation, an oxygen peak can be formed at the bond interface 418. In some implementations, the bond interface 418 can comprise silicon oxynitride, silicon oxycarbonitride, or silicon carbonitride. As explained herein, the direct bond can comprise a covalent bond, which is stronger than van Der Waals bonds. The bonding layers

408*a* and 408*b* can also comprise polished surfaces that are planarized to a high degree of smoothness.

In various implementations, the metal-to-metal bonds between the conductive features 406*a* and 406*b* can be joined such that metal grains grow into each other across the bond interface 418. In some implementations, the metal is or includes copper, which can have grains oriented along the 411 crystal plane for improved copper diffusion across the bond interface 418. In some implementations, the conductive features 406*a* and 406*b* may include nanotwinned copper grain structure, which can aid in merging the conductive features during anneal. The bond interface 418 can extend substantially entirely to at least a portion of the bonded conductive features 406*a* and 406*b*, such that there is substantially no gap between the non-conductive bonding layers 408*a* and 408*b* at or near the bonded conductive features 406*a* and 406*b*. In some implementations, a barrier layer may be provided under and/or laterally surrounding the conductive features 406*a* and 406*b* (e.g., which may include copper). In other implementations, however, there may be no barrier layer under the conductive features 406*a* and 406*b*, for example, as described in U.S. Pat. No. 11,195,748, which is incorporated by reference herein in its entirety and for all purposes.

Beneficially, the use of the hybrid bonding techniques described herein can enable extremely fine pitch between adjacent conductive features 406*a* and 406*b*, and/or small pad sizes. For example, in various implementations, the pitch p (e.g., the distance from edge-to-edge or center-to-center, as shown in FIG. 4A) between adjacent conductive features 406*a* (or 406*b*) can be in a range of 0.5 microns to 50 microns, in a range of 0.75 microns to 25 microns, in a range of 1 micron to 25 microns, in a range of 1 micron to 10 microns, or in a range of 1 micron to 5 microns. Further, a major lateral dimension (e.g., a pad diameter) can be small as well, e.g., in a range of 0.25 microns to 30 microns, in a range of 0.25 microns to 5 microns, or in a range of 0.5 microns to 5 microns.

As described above, the non-conductive bonding layers 408*a*, 408*b* can be directly bonded to one another without an adhesive and, subsequently, the bonded structure 400 can be annealed. Upon annealing, the conductive features 406*a*, 406*b* can expand and contact one another to form a metal-to-metal direct bond. In some implementations, the materials of the conductive features 406*a*, 406*b* can interdiffuse during the annealing process.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

Several illustrative examples of testing elements for bonded structures and related systems and methods have been disclosed. Although this disclosure has been described in terms of certain illustrative examples and uses, other examples and other uses, including examples and uses which do not provide all of the features and advantages set forth herein, are also within the scope of this disclosure. Components, elements, features, acts, or steps may be arranged or performed differently than described and components, elements, features, acts, or steps may be combined, merged, added, or left out in various examples. All possible combinations and subcombinations of elements and components described herein are intended to be included in this disclosure. No single feature or group of features is necessary or indispensable.

Certain features that are described in this disclosure in the context of separate implementations may also be implemented in combination in a single implementation. Conversely, various features that are described in the context of a single implementation also may be implemented in multiple implementations separately or in any suitable subcombination. Moreover, although features may be described above as acting in certain combinations, one or more features from a claimed combination may in some cases be excised from the combination, and the combination may be claimed as a subcombination or variation of a subcombination.

Further, while illustrative examples have been described, any examples having equivalent elements, modifications, omissions, and/or combinations are also within the scope of this disclosure. Moreover, although certain aspects, advantages, and novel features are described herein, not necessarily all such advantages may be achieved in accordance with any particular example. For example, some examples within the scope of this disclosure achieve one advantage, or a group of advantages, as taught herein without necessarily achieving other advantages taught or suggested herein. Further, some examples may achieve different advantages than those taught or suggested herein.

Some examples have been described in connection with the accompanying drawings. The figures may or may not be drawn and/or shown to scale, but such scale should not be limiting, since dimensions and proportions other than what are shown are contemplated and are within the scope of the disclosed invention. Distances, angles, etc. are merely illustrative and do not necessarily bear an exact relationship to actual dimensions and layout of the devices illustrated. Components may be added, removed, and/or rearranged. Further, the disclosure herein of any particular feature, aspect, method, property, characteristic, quality, attribute, element, or the like in connection with various examples may be used in all other examples set forth herein. Additionally, any methods described herein may be practiced using any device suitable for performing the recited steps.

For purposes of summarizing the disclosure, certain aspects, advantages, and features of the inventions have been described herein. Not all, or any such advantages are necessarily achieved in accordance with any particular example of the inventions disclosed herein. No aspects of this disclosure are essential or indispensable. In many examples, the devices, systems, and methods may be configured differently than illustrated in the figures. or description herein. For example, various functionalities provided by the illustrated modules may be combined, rearranged, added, or deleted. In some implementations, additional or different processors or modules may perform some or all of the functionalities described with reference to the examples described and illustrated in the figures. Many implementation variations are possible. Any of the features, structures, steps, or processes disclosed in this specification may be included in any example.

What is claimed is:

1. An integrated circuit device comprising:

a first active circuitry in a device portion of the integrated circuit device;

a first non-conductive layer over the device portion, the first non-conductive layer at least partially defining a direct bonding surface of the integrated circuit device; and a trace line connected to the first active circuitry and extending at least partially into the first non-conductive layer, wherein, during operation of the integrated circuit device, the trace line is configured to provide electrical communication between the first active circuitry and a debugging chip by transmitting one or more signals from the debugging chip to the first active circuitry, wherein the one or more signals probe one or more portions of the first active circuitry for debugging the first active circuitry, and by conveying one or more return signals emitted from the first active circuitry to the debugging chip, the trace line terminating at or below the direct bonding surface.

2. The integrated circuit device of claim 1, further comprising a plurality of contact features at least partially embedded within the first non-conductive layer, the plurality of contact features configured to connect only to corresponding contact features of the debugging chip.

3. The integrated circuit device of claim 2, wherein the first non-conductive layer comprises a bonding surface prepared for direct hybrid bonding.

4. The integrated circuit device of claim 2, wherein the plurality of contact features is connected to the trace line.

5. The integrated circuit device of claim 2, further comprising a second non-conductive layer over the first non-conductive layer.

6. The integrated circuit device of claim 1, wherein the trace line terminates at or below a bonding surface of the integrated circuit device, the trace line not connected to a contact pad at the bonding surface of the integrated circuit device.

7. An integrated circuit comprising the integrated circuit device of claim 1, the bonded structure further comprising a debugging element directly bonded to the integrated circuit device, wherein a first non-conductive layer of the integrated circuit device is directly bonded to a second non-conductive layer of the debugging element without an intervening adhesive; and wherein a first contact feature of the integrated circuit device is directly bonded to a second contact feature of the debugging element without an intervening adhesive.

8. The integrated circuit of claim 7, wherein the debugging chip is configured to debug the first active circuitry.

9. A bonded structure comprising:

an integrated circuit device comprising first active circuitry; and a debugging element comprising debugging circuitry, the debugging element directly bonded to the integrated circuit device without an adhesive along a bonding interface;

wherein the debugging circuitry is configured to debug logic of the first active circuitry of the integrated circuit device by, during operation of the bonded structure, transmitting one or more signals from the debugging element to the first active circuitry, wherein the one or more signals probe one or more portions of the first active circuitry, and receiving one or more return signals emitted from the first active circuitry.

10. The bonded structure of claim 9, wherein the debugging element comprises a chip.

11. The bonded structure of claim 9, wherein a first non-conductive bonding layer of the integrated circuit device is directly bonded to a second non-conductive bonding layer of the debugging element without an intervening adhesive; and wherein a first contact feature of the integrated circuit device is directly bonded to a second contact feature of the debugging element without the intervening adhesive.

12. The bonded structure of claim 11, wherein a majority of the first and second contact features are configured to debug at least a portion of the first active circuitry of the integrated circuit device.

13. The bonded structure of claim 12, wherein debugging at least a portion of the first active circuitry comprises probing the first active circuitry so as to produce a one or more signals from the first active circuitry;

collecting the one or more signals;

storing the one or more signals; and analyzing the one or more signals.

14. The bonded structure of claim 13, wherein the debugging circuitry is configured to transmit one or more signals to the first active circuitry.

15. The bonded structure of claim 14, wherein the one or more signals probe one or more portions of the first active circuitry.

16. A debugging chip comprising:

a debugging circuitry, wherein the debugging circuitry is configured to debug a circuitry of an element directly bonded to the debugging chip during operation of the debugging chip, wherein debugging the circuitry of the element comprises analyzing signals emitted from the element, transmitting one or more signals to the circuitry of the element, wherein the one or more signals probe one or more portions of the circuitry of the element, and receiving one or more return signals emitted from the circuitry of the element; and a bonding layer configured for direct hybrid bonding without an adhesive, the bonding layer comprising a non-conductive bonding layer and a plurality of contact features at least partially embedded within the non-conductive bonding layer.

17. The debugging chip of claim 16, wherein the debugging chip is directly bonded to an integrated circuit device, without an adhesive, wherein the integrated circuit device comprises an active circuitry.

18. The debugging chip of claim 17, wherein the debugging circuitry is configured to probe the active circuitry of the integrated circuit device.

19. The debugging chip of claim 18, wherein the debugging circuitry is configured to store signals produced from the active circuitry of the integrated circuit device.

20. The debugging chip of claim 19, wherein the debugging circuitry is configured to manipulate signals produced from the active circuitry of the integrated circuit device.

* * * * *